US012727197B2

(12) United States Patent
Li et al.

(10) Patent No.: US 12,727,197 B2
(45) Date of Patent: Sep. 1, 2026

(54) THIN FILM TRANSISTOR AND ELECTRONIC DEVICE THEREOF

(71) Applicant: WUHAN CHINA STAR OPTOELECTRONICS TECHNOLOGY CO., LTD., Wuhan (CN)

(72) Inventors: Zhifu Li, Wuhan (CN); Guanghui Liu, Wuhan (CN); Fei Ai, Wuhan (CN); Dewei Song, Wuhan (CN); Chengzhi Luo, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 206 days.

(21) Appl. No.: 18/560,932

(22) PCT Filed: Jun. 29, 2023

(86) PCT No.: PCT/CN2023/104225
§ 371 (c)(1),
(2) Date: Nov. 15, 2023

(87) PCT Pub. No.: WO2024/045860
PCT Pub. Date: Mar. 7, 2024

(65) Prior Publication Data

US 2025/0081522 A1 Mar. 6, 2025

(30) Foreign Application Priority Data

Aug. 30, 2022 (CN) ........................ 202211048378.X

(51) Int. Cl.
*H10D 30/67* (2025.01)
*H10D 62/17* (2025.01)

(52) U.S. Cl.
CPC ....... *H10D 30/6728* (2025.01); *H10D 62/292* (2025.01)

(58) Field of Classification Search
None
See application file for complete search history.

(56) References Cited

U.S. PATENT DOCUMENTS 6,747,313 B1 6/2004 Gil
2022/0384550 A1* 12/2022 Li ...................... H10K 59/1213
2024/0276772 A1* 8/2024 Xu .................. H10K 59/80515

FOREIGN PATENT DOCUMENTS

CN 105762196 A 7/2016
CN 110024133 A 7/2019
(Continued)

OTHER PUBLICATIONS

Chinese Office Action issued in corresponding Chinese Patent Application No. 202211048378.X dated Apr. 8, 2025, pp. 1-8.
(Continued)

*Primary Examiner* — Michelle Mandala
(74) *Attorney, Agent, or Firm* — PV IP PC; Christopher S. Ruprecht; Wei Te Chung

(57) ABSTRACT

The present application provides a thin film transistor and an electronic device thereof. An active layer of the thin film transistor includes: a first active layer, a channel layer and a second active layer that are stacked, the first active layer includes a first doped portion and a second doped portion, the first doped portion is connected to the channel layer and the second doped portion, and a concentration of dopant ions in the first doped portion is less than a concentration of dopant ions in the second doped portion. The leakage current is reduced, and the mobility in the "channel region" of the thin film transistor is improved.

20 Claims, 6 Drawing Sheets

(56) References Cited

FOREIGN PATENT DOCUMENTS

| | | | |
|---|---|---|---|
| CN | 110085678 | A | 8/2019 |
| CN | 110137356 | A | 8/2019 |
| CN | 115425090 | A | 12/2022 |
| JP | 01283879 | A | 11/1989 |
| JP | 11284192 | A | 10/1999 |
| PH | 11163172 | A | 6/1999 |

OTHER PUBLICATIONS

International Search Report in International application No. PCT/CN2023/104225, mailed on Sep. 3, 2023.

Written Opinion of the International Search Authority in International application No. PCT/CN2023/104225, mailed on Sep. 3, 2023.

* cited by examiner

THIN FILM TRANSISTOR AND ELECTRONIC DEVICE THEREOF

CROSS-REFERENCE TO RELATED APPLICATION

This application is a national stage of International Application No. PCT/CN2023/104225, filed on Jun. 29, 2023. The aforementioned application is hereby incorporated by reference in its entirety.

TECHNICAL FIELD

The present application relates to the field of display technologies, and in particular to a thin film transistor and an electronic device thereof.

BACKGROUND

With the continuous development of display technologies, requirements for the resolution parameter of a display panel are getting higher and higher. Therefore, array substrates are required to have ultra-high resolution and sub-micron device size. In order to meet these requirements, sizes of thin film transistor devices on the array substrate and an area occupied by the thin film transistor devices should be reduced as much as possible. However, limited by exposure accuracy and etching accuracy, conventional thin film transistors usually have a channel length of an active layer greater than 1 micron, resulting in the fact that both the sizes of the thin film transistor devices and the area occupied by the thin film transistor devices cannot be further reduced.

At present, existing thin film transistor devices with vertical structures (vertical thin film transistor devices) may overcome the problems of large size and occupied area with stacked doped portion and channel portion of an active layer. In addition, a channel length also needs to be reduced as much as possible to improve the mobility in the polycrystalline silicon (Poly-Si) active layer. However, the channel length of the vertical thin film transistor is too small, which easily leads to an increase in leakage current and is detrimental to the device stability of the thin film transistor.

The present application provides a thin film transistor and an electronic device thereof, so as to improve the technical problem that the current thin film transistor device with the vertical structure has an increased leakage current due to the channel length being too small, which in turn causes the device stability to decrease.

In order to solve the above problems, the technical solutions provided by the present application are as follows.

The present application provides a thin film transistor, and the thin film transistor includes:

- an insulating substrate; and
- an active layer disposed on the insulating substrate, the active layer including: a first active layer, a channel layer and a second active layer that are stacked;
- where the first active layer includes a first doped portion and a second doped portion, the first doped portion is connected to the channel layer and the second doped portion, and a concentration of dopant ions in the first doped portion is less than a concentration of dopant ions in the second doped portion.

For the thin film transistor in the present application, a ratio of the concentration of the dopant ions in the first doped portion to the concentration of the dopant ions in the second doped portion is in a range of $1/10$ to $1/5$.

For the thin film transistor in the present application, the first doped portion and the second doped portion are disposed on the insulating substrate in a same layer, in a thickness direction of the insulating substrate, a thickness of the second doped portion is less than or equal to a thickness of the first doped portion. $1/4$ to 1.

For the thin film transistor in the present application, the channel layer corresponds to the first doped portion in the thickness direction of the insulating substrate;

- where an orthographic projection of the channel layer on the first active layer partially overlaps with each of the first doped portion and the second doped portion.

For the thin film transistor in the present application, the channel layer corresponds to the first doped portion in the thickness direction of the insulating substrate;

- where an orthographic projection of the channel layer on the first active layer is located in the first doped portion, and the orthographic projection of the channel layer on the first active layer dose not overlap with the second doped portion.

For the thin film transistor in the present application, the thin film transistor further includes a gate electrode layer, the gate electrode layer is insulated from and annularly arranged at a periphery of the channel layer;

- where an orthographic projection of the channel layer on the gate electrode layer at least partially overlaps with the gate electrode layer.

For the thin film transistor in the present application, the gate electrode layer includes a first gate electrode portion and a second gate electrode portion that are integrally connected, the first gate electrode portion is disposed above the insulating substrate, and the second gate electrode portion is insulated from and disposed above the second doped portion;

- where an orthographic projection of the channel layer on the first gate electrode portion is located in the first gate electrode portion, and an orthographic projection of the channel layer on the second gate electrode portion at least partially overlaps with the second gate electrode portion.

For the thin film transistor in the present application, an orthographic projection of the second gate electrode portion on the insulating substrate partially overlaps with an orthographic projection of the channel layer on the insulating substrate.

For the thin film transistor in the present application, the channel layer includes dopant ions, and a concentration of dopant ions at a side of the channel layer away from the insulating substrate is greater than a concentration of dopant ions at a side of the channel layer proximate to the insulating substrate.

For the thin film transistor in the present application, the thin film transistor further includes a first insulating layer disposed between the active layer and the gate electrode layer;

- where the first insulating layer covers a surface of the second doped portion, the surface of the second doped portion and a portion of a surface of the insulating substrate.

For the thin film transistor in the present application, the thin film transistor further includes a second insulating layer and a source and drain electrode layer, the second insulating layer covers the first insulating layer and the gate electrode layer, and the source and drain electrode layer is disposed on the second insulating layer;

- where a first via hole and a second via hole are provided in the first insulating layer and the second insulating layer, and the source and drain electrode layer is connected to the second doped portion through the first via hole, and the source and drain electrode layer is connected to the second doped portion through the second via hole.

For the thin film transistor in the present application, the thin film transistor further includes a light-shielding layer disposed in the insulating substrate, and an orthographic projection of the active layer on the light-shielding layer is located in the light-shielding layer;

where the gate electrode layer and the light-shielding layer are connected through a third via hole.

The present application also provides an electronic device. The electronic device includes a thin film transistor, and the thin film transistor includes:

an insulating substrate; and an active layer disposed on the insulating substrate, the active layer including: a first active layer, a channel layer and a second active layer that are stacked;

where the first active layer includes a first doped portion and a second doped portion, the first doped portion is connected to the channel layer and the second doped portion, and a concentration of dopant ions in the first doped portion is less than a concentration of dopant ions in the second doped portion.

For the electronic device in the present application, a ratio of the concentration of the dopant ions in the first doped portion to the concentration of the dopant ions in the second doped portion is in a range of 1/10 to 1/5.

For the electronic device in the present application, the first doped portion and the second doped portion are disposed on the insulating substrate in a same layer, in a thickness direction of the insulating substrate, a thickness of the second doped portion is less than or equal to a thickness of the first doped portion.

For the electronic device in the present application, in the thickness direction of the insulating substrate, a ratio of the thickness of the second doped portion to the thickness of the first doped portion is in a range of 1/4 to 1.

For the electronic device in the present application, the channel layer corresponds to the first doped portion in the thickness direction of the insulating substrate;

where an orthographic projection of the channel layer on the first active layer partially overlaps with each of the first doped portion and the second doped portion.

For the thin film transistor in the present application, the channel layer corresponds to the first doped portion in the thickness direction of the insulating substrate;

where an orthographic projection of the channel layer on the first active layer is located in the first doped portion, and the orthographic projection of the channel layer on the first active layer does not overlap with the second doped portion.

For the electronic device in the present application, the thin film transistor further includes a gate electrode layer, the gate electrode layer is insulated from and annularly arranged at a periphery of the channel layer;

where an orthographic projection of the channel layer on the gate electrode layer at least partially overlaps with the gate electrode layer.

In the present application, the first active layer is arranged to include the first doped portion and the second doped portion with different dopant ion concentrations, so that the second doped portion and the second active layer serve as two "doped regions" of the thin film transistor, respectively, and the channel layer and the first doped portion constitute a "channel region" of the thin film transistor, which equivalently increases the channel length. As a result, the leakage current is reduced. In addition, since the first doped portion is doped with ions, the first doped portion has a higher mobility than the channel layer, which equivalently improves the mobility in the "channel region" of the thin film transistor. Therefore, the thin film transistor provided in the present application may solve the problems of excessive leakage current and low mobility of the vertical thin film transistors.

BRIEF DESCRIPTION OF THE DRAWINGS

In order to describe the technical solutions in the embodiments of the present application more clearly, accompanying drawings to be used in the description of the embodiments will be briefly introduced below. Obviously, the accompanying drawings to be described below are merely accompanying drawings of some embodiments of the present application. For those of ordinary skill in the art, other drawings can be obtained based on these drawings without creative efforts.

Figure 1:
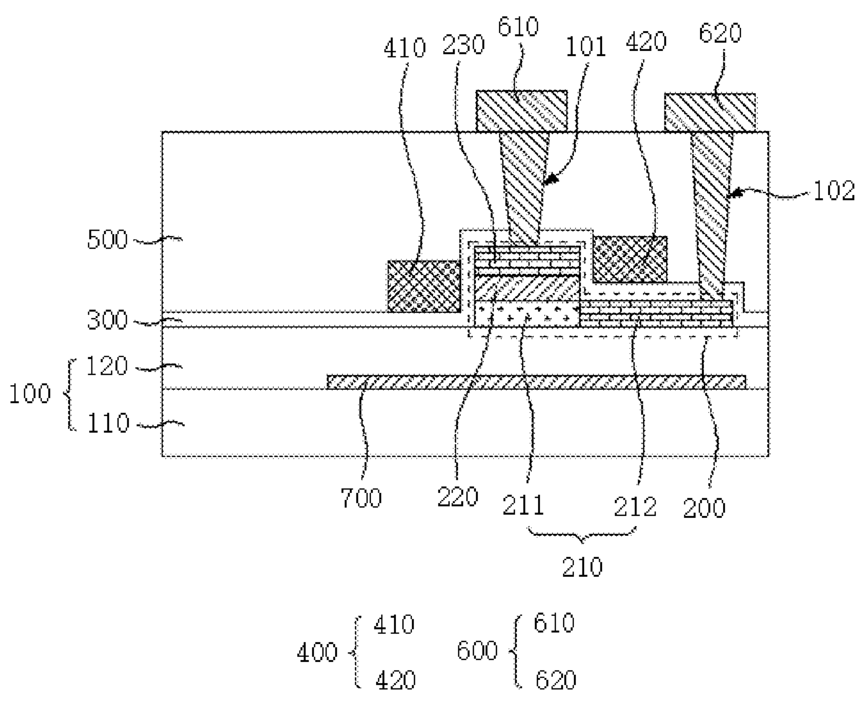
FIG. 1 is a structural diagram of a thin film transistor with a first stacked structure in the present application.

Explanation of reference marks:

100. insulating substrate; 101. first via hole; 102. second via hole; 103. third via hole; 110. base substrate; 120. buffer layer;

200. active layer; 210. first active layer; 211. first doped portion; 212. second doped portion; 220. channel layer; 230. second active layer;

300. first insulating layer;

400. gate electrode layer; 410. first gate electrode portion; 420. second gate electrode portion;

500. second insulating layer;

600. source and drain electrode layer; 610. source electrode; 620. drain electrode;

700. light-shielding layer.

DETAILED DESCRIPTION OF THE PREFERRED EMBODIMENTS

The technical solutions in the embodiments of the present application will be clearly and completely described below with reference to the accompanying drawings in the embodiments of the present application. Obviously, embodiments described are only some of the embodiments of the present application, rather than all of the embodiments. Based on the embodiments of the present application, all other embodiments obtained by those skilled in the art without creative efforts fall within the scope of protection of the present application. In addition, it will be understood that the specific embodiments described herein are only used to illustrate and explain the present application, and are not used to limit the present application. In the present application, unless otherwise specified, a directional term used such as “upper” or “lower” usually refers to an upper side or a lower side of a device in actual use or in a working condition, and in particular to a direction in the drawings. In addition, terms such as “inside” and “outside” refer to a side related to an outline of the device.

At present, existing vertical thin film transistor devices may overcome the problems of large size and occupied area with stacked doped portion and channel portion of an active layer. In addition, a channel length also needs to be reduced as much as possible to improve the mobility in the polycrystalline silicon (Poly-Si) active layer. However, the channel length of the vertical thin film transistor is too small, which easily leads to an increase in leakage current and is detrimental to the device stability of the thin film transistor. In light of the technical problems, the present application provides following schemes.

Referring to FIGS. 1 to 6, a thin film transistor is provided in the present application. The thin film transistor includes an insulating substrate 100 and an active layer 200 disposed on the insulating substrate 100. The active layer 200 includes a first active layer 210, a channel layer 220 and a second active layer 230 that are stacked. The first active layer 210 includes a first doped portion 211 and a second doped portion 212. The first doped portion 211 is connected to the channel layer 220 and the second doped portion 212, and a concentration of the dopant ions in the first doped portion 211 is less than a concentration of the dopant ions in the second doped portion 212.

In the present application, the first active layer 210 is arranged to include the first doped portion 211 and the second doped portion 212 with different dopant ion concentrations, so that the second doped portion 212 and the second active layer 230 serve as two “doped regions” of the thin film transistor, respectively; and the channel layer 220 and the first doped portion 211 constitute a “channel region” of the thin film transistor, which has equivalently increased the channel length. As a result, the leakage current is reduced. In addition, since the first doped portion 211 is doped with ions, the first doped portion 211 has a higher mobility than the channel layer 220, which has equivalently improved the mobility in the “channel region” of the thin film transistor. Therefore, the thin film transistor provided in the present application may solve the problems of excessive leakage current and low mobility of the vertical thin film transistor.

The technical solutions of the present application will now be described in conjunction with to specific embodiments. It will be noted that the order for describing the following embodiments does not limit the preferred order of the embodiments.

Referring to FIG. 1, for the thin film transistor in the present application, the insulating substrate 100 may include a base substrate 110 and a buffer layer 120 disposed on the base substrate 110. The base substrate 110 may be a glass substrate or a polyimide substrate, and the buffer layer 120 may be an inorganic film layer such as SiOx, SiNx, SiON, or a stacked layer thereof.

In the embodiments, the active layer 200 may be made of polysilicon.

In the embodiments, the first active layer 210 and the second active layer 230 each may be a polysilicon film layer doped with phosphorus ions.

In the embodiments, the concentration of the doped phosphorus ions in the second doped portion 212 of the first active layer 210 may be the same as the concentration of the doped phosphorus ions in the second active layer 230. Alternatively, the concentration of the doped phosphorus ions in the second doped portion 212 may be greater than the concentration of the doped phosphorus ions in the second active layer 230.

In the embodiments, the concentration of the doped phosphorus ions in the first doped portion 211 of the first active layer 210 may be different from each of the concentration of the doped phosphorus ions in the second doped portion 212 and the concentration of the doped phosphorus ions in the second active layer 230. Specifically, the concentration of the doped phosphorus ions in the first doped portion 211 may be less than each of the concentration of the doped phosphorus ions in the second doped portion 212 and the concentration of the doped phosphorus ions in the second active layer 230.

In the embodiments, the different concentrations of the doped phosphorus ions in the first doped portion 211 and the second doped portion 212 of the first active layer 210 and in the second active layer 230 may be realized by doping these portions and layers different times. For example, the first doped portion 211 of the first active layer 210 may be formed by one doping process, and the second doped portion 212 and/or the second active layer 230 may be formed by two or more doping processes. It will be noted that, in the embodiments, the numbers of doping processes for the first doped portion 211, the second doped portion 212 and the second active layer 230 are not limited to one, two, three, etc. The specific numbers of doping processes may be adjusted according to different requirements of the concentrations of the doped phosphorus ions in the first doped portion 211, the second doped portion 212 and the second active layer 230, and the present application does not impose specific restrictions on this.

In the embodiments, a ratio of the concentration of the dopant ions in the first doped portion 211 to the concentration of the dopant ions in the second doped portion 212 may be any numerical value in a range of 1/10 to 1/5. For example, in an embodiment, the ratio of the concentration of the dopant ions in the first doped portion 211 to the concentration of the dopant ions in the second doped portion 212 may be 1:10. In another embodiment, the ratio of the concentration of the dopant ions in the first doped portion 211 to the concentration of the dopant ions in the second doped portion 212 may be 3:20. In yet another embodiment, the ratio of the concentration of the dopant ions in the first doped portion 211 to the concentration of the dopant ions in the second doped portion 212 may be 1:5. It will be noted that the ratio of the concentration of the dopant ions in the first doped portion 211 to the concentration of the dopant ions in the second doped portion 212 may also be other numerical value between 1/10 and 1/5, and the numerical values in the embodiments are only examples and are not exhaustive.

In the embodiments, by setting the ratio of the concentration of the dopant ions in the first doped portion 211 to the concentration of the dopant ions in the second doped portion 212 to be in the range of 1/10 to 1/5, it may be possible that the first doped portion 211 and the second doped portion 212 have an appropriate concentration difference of dopant ions therebetween, thereby achieving both the effects of reducing the leakage current and improving the channel mobility.

In the embodiments, the channel layer 220 may also include dopant ions. Specifically, the dopant ions may be phosphorus ions.

In the embodiments, a concentration of dopant ions at a side of the channel layer 220 away from the insulating substrate 100 may be greater than a concentration of dopant ions at a side of the channel layer 220 proximate to the insulating substrate 100. The dopant ions in the channel layer 220 may be from the phosphorus ions entered downward during doping of the second active layer 230, and therefore the concentration of the dopant ions entered into the channel layer 220 gradually decreases along a direction away from the second active layer 230 until there is no dopant ion.

Figure 2:
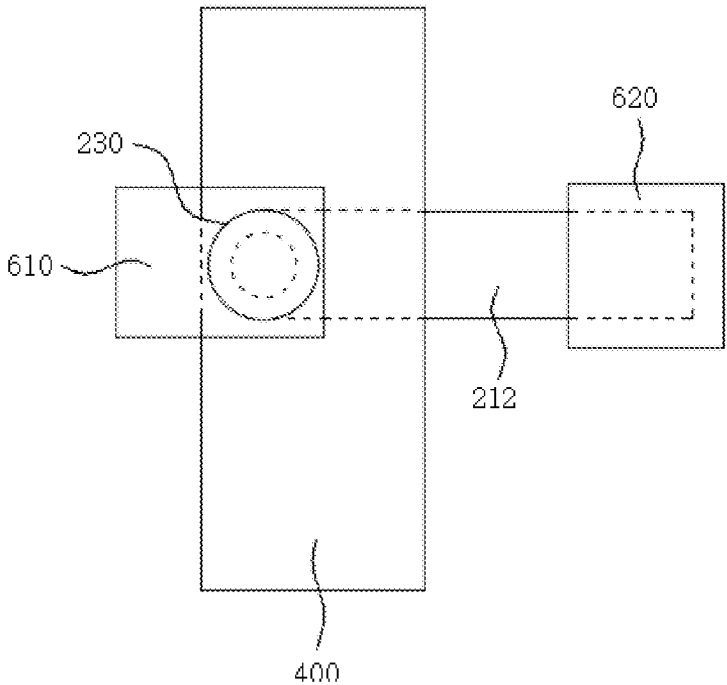
FIG. 2 is a plane structural diagram of the thin film transistor in the present application.

Referring to FIGS. 1 and 2, for the thin film transistor in the present application, the first doped portion 211 and the second doped portion 212 may be disposed on the insulating substrate 100 in a same layer. Specifically, the first doped portion 211 and the second doped portion 212 may be integrally formed on the insulating substrate 100 by using the polysilicon material that forms the first active layer 210, where the polysilicon material in the two portions is doped to different dopant levels to form the first doped portion 211 and the second doped portion 212 that are arranged in the same layer but have different concentrations of the dopant ions.

In the embodiments, in a thickness direction of the insulating substrate 100 (i.e., in a direction perpendicular to the insulating substrate 100), a thickness of the second doped portion 212 may be less than or equal to a thickness of the first doped portion 211.

Specifically, referring to FIGS. 1 and 2, in a case where the thickness of the second doped portion 212 is equal to the thickness of the first doped portion 211, the first doped portion 211 and the second doped portion 212 constitute a film layer integrally formed on the insulating substrate 100 by the polysilicon material that forms the first active layer 210. In this case, the only difference between the first doped portion 211 and the second doped portion 212 is the concentration of the dopant ions, and the first doped portion 211 and the second doped portion 212 only need to be formed by different number of doping processes. For the first doped portion 211 and the second doped portion 212, the manufacturing process is simple and has a relatively low cost.

Figure 3:
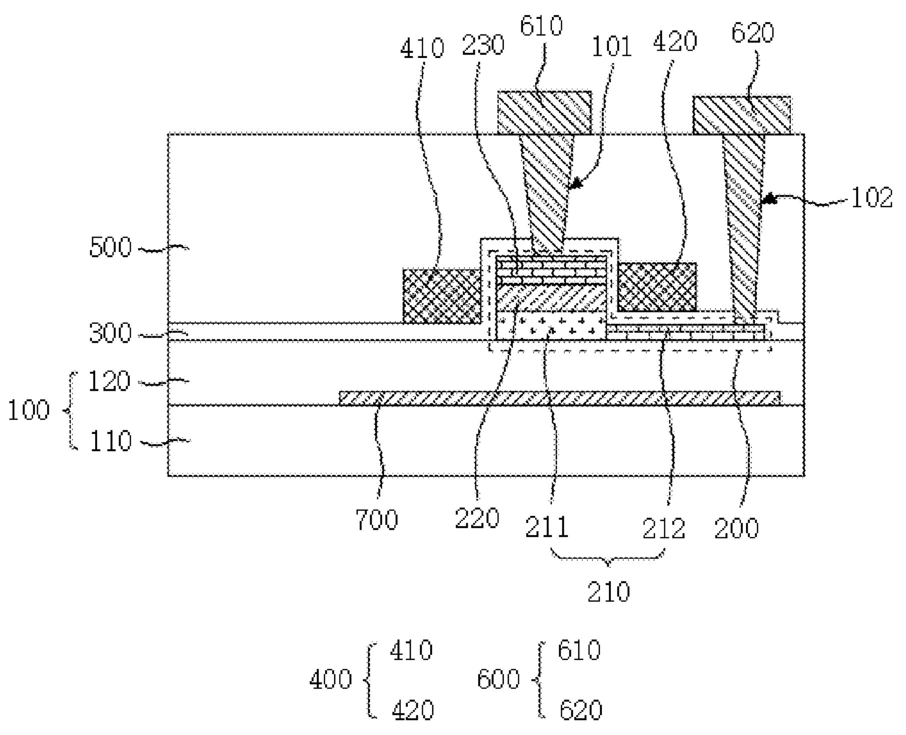
FIG. 3 is a structural diagram of a thin film transistor with a second stacked structure in the present application.

Referring to FIGS. 2 and 3, in a case where the thickness of the second doped portion 212 is less than the thickness of the first doped portion 211, the first doped portion 211 and the second doped portion 212 are formed by following processes. After the polysilicon material of the first active layer 210 is formed on the insulating substrate 100, photolithography and (and etching) processes are performed at a position corresponding to the second doped portion 212, so that a thickness of a polysilicon material corresponding to the second doped portion 212 is less than a thickness of a polysilicon material corresponding to the first doped portion 211. In this case, considering a surface of the insulating substrate 100 proximate to the first active layer 210 as a reference plane, a height of a surface of the second doped portion 212 away from the insulating substrate 100 is lower than a height of a surface of the first doped portion 211 away from the insulating substrate 100, so that a gap exists between the channel layer 220 on the first doped portion 211 and the second doped portion 212. As a result, the possibility of direct contact between the channel layer 220 and the second doped portion 212 is reduced or avoided, which reduces the risk of carriers being directly transmitted from the channel layer 220 to the second doped portion 212 or from the second doped portion 212 to the channel layer 220, thereby further improving the stability of reducing the leakage current of the thin film transistor.

In the embodiments, in the direction perpendicular to the insulating substrate 100, a ratio of the thickness of the second doped portion 212 to the thickness of the first doped portion 211 may be any numerical value in a range of ¼ and 1. Specifically, for example, in an embodiment, the ratio of the thickness of the second doped portion 212 to the thickness of the first doped portion 211 may be ¼. In another embodiment, the ratio of the thickness of the second doped portion 212 to the thickness of the first doped portion 211 may be ½. In yet another embodiment, the ratio of the thickness of the second doped portion 212 to the thickness of the first doped portion 211 may be 1. It will be noted that the ratio of the thickness of the second doped portion 212 to the thickness of the first doped portion 211 may also be other numerical value between ¼ and 1, and the numerical values in the embodiments are only examples and are not exhaustive.

In the embodiments, by setting the ratio of the thickness of the second doped portion 212 to the thickness of the first doped portion 211 to be in the range of ¼ to 1, it may be possible that the thickness of the second doped portion 212 to satisfies both the stability requirement of reducing the leakage current of the thin film transistor and the mobility requirement of carriers in the active layer 200 of the thin film transistor, thereby achieving a balanced performance.

Figure 4:
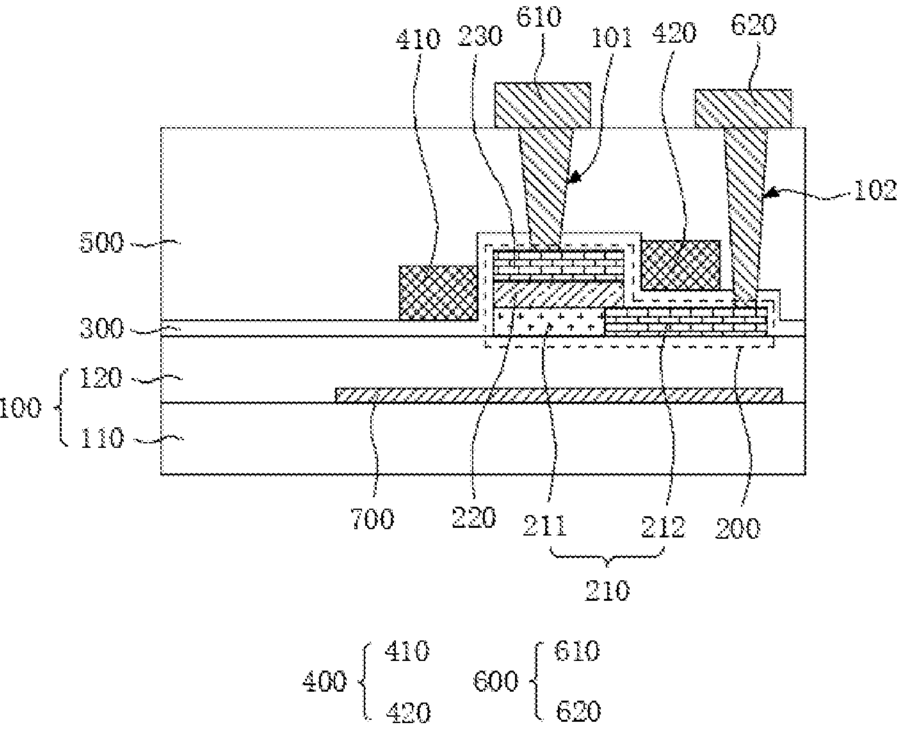
FIG. 4 is a structural diagram of a thin film transistor with a third stacked structure in the present application.

Referring to FIG. 4, for the thin film transistor in the present application, the channel layer 220 may correspond to the first doped portion 211 in the direction perpendicular to the insulating substrate 100, that is to say, the channel layer 220 may be disposed on the first doped portion 211, so that carriers need to pass through the first doped portion 211 when transmitted between the channel layer 220 and the second doped portion 212. As a result, the channel length of the "channel region" is extended, and thus the leakage current is reduced.

In the embodiments, an orthographic projection of the channel layer 220 on the first active layer 210 may partially overlap with each of the first doped portion 211 and the second doped portion 212. That is, the channel layer 220 is disposed on both the first doped portion 211 and the second doped portion 212, that is to say, the channel layer 220 crosses over the first doped portion 211 and the second doped portion 212. In this case, a width of the channel layer 220 in a direction from the first doped portion 211 to the second doped portion 212 is extended, which equivalently increases a width of the "channel region" being increased. That is, a "channel width-to-length ratio" of the channel region is increased. As a result, the probability of carriers not being captured by an interface gap state during migration is relatively high, that is to say, carriers are more likely to drift, which is conducive to reducing a threshold voltage of the thin film transistor.

In the embodiments, in a case where the thickness of the second doped portion 212 is the same as the thickness of the first doped portion 211, two carrier transmission paths exist between the channel layer 220 and the second doped portion 212. A first path is a path through which the channel layer 220 is directly connected to the second doped portion 212, and a second path is a path through which the channel layer 220 is connected to the second doped portion 212 through the first doped portion 211. When the thin film transistor operates, most of the carriers are transmitted through the first path, and a small part of the carriers is transmitted through the second path. In this case, the carrier mobility of the thin film transistor is relatively high, but the leakage current is relatively large.

In the embodiments, in a case where the thickness of the second doped portion 212 is different from the thickness of the first doped portion 211, only one carrier transmission path exists between the channel layer 220 and the second doped portion 212. The transmission path is the path through which the channel layer 220 is connected to the second doped portion 212 through the first doped portion 211. That is, the transmission path is the second path. In this case, compared with the manner in which the carriers are transmitted through the first path and the second path, the mobility of the thin film transistor is reduced, but the leakage current can be improved significantly.

Figure 5:
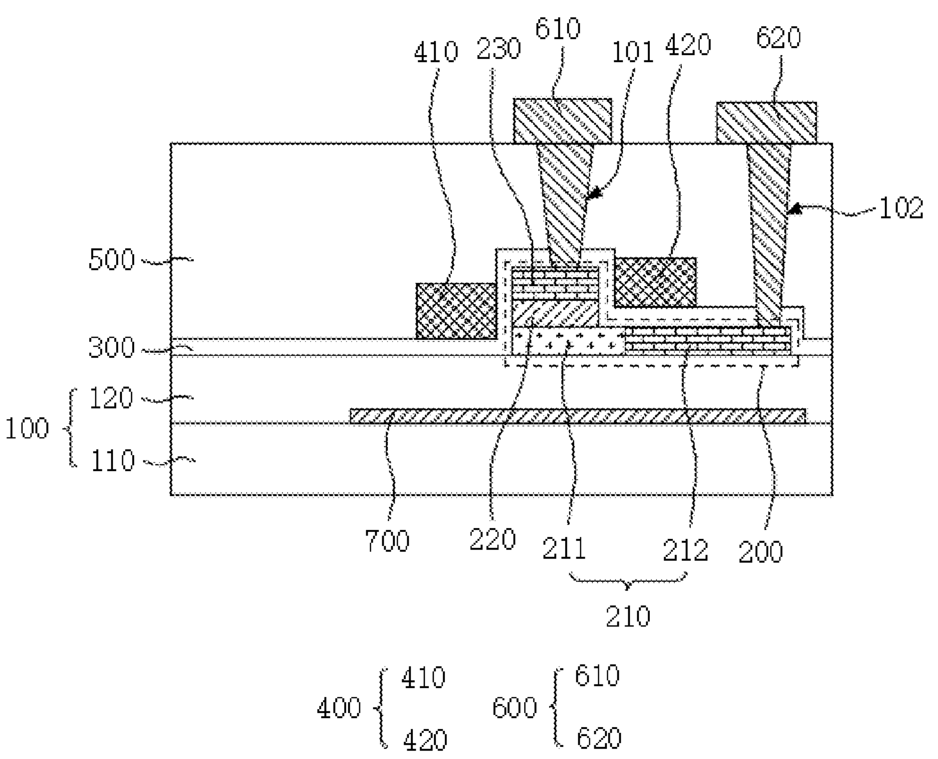
FIG. 5 is a structural diagram of a thin film transistor with a fourth stacked structure in the present application.

Referring to FIGS. 1 and 5, for the thin film transistor in the present application, in the direction perpendicular to the insulating substrate 100, the orthographic projection of the channel layer 220 on the first active layer 210 is located in the first doped portion 211 and the orthographic projection of the channel layer 220 on the first active layer 210 does not overlap with the second doped portion 212. That is to say, an edge of the channel layer 220 does not exceed a boundary between the first doped portion 211 and the second doped portion 212, so that a spacing exists between the edge of the channel layer 220 and the second doped portion 212 in the direction from the first doped portion 211 to the second doped portion 212. As a result, it may also reduce or avoid the possibility of the direct contact between the channel layer 220 and the second doped portion 212, which reduces the risk of the carriers being directly transmitted from the channel layer 220 to the second doped portion 212 or the carriers being directly transmitted from the second doped portion 212 to the channel layer 220, thereby further improving the stability of reducing the leakage current of the thin film transistor.

Referring to FIG. 1, for the thin film transistor in the present application, the thin film transistor may further include: a first insulating layer 300 disposed on the active layer 200, a gate electrode layer 400 and a second insulating layer 500 that are disposed on the first insulating layer 300, and a source and drain electrode layer 600 disposed on the second insulating layer 500.

In the embodiments, the first insulating layer 300 is continuously arranged and covers a surface of the active layer 200 and a surface of a region of the insulating substrate 100 where the active layer 200 is not located. In this case, the first insulating layer 300 covers surfaces of the second active layer 230 and the second doped portion 212 of the active layer 200 which are in a surface of the stacked structure, so that the second active layer 230 can be insulated from other film layers.

In the embodiments, the first insulating layer 300 may be an inorganic film layer such as SiOx, SiNx, SiON, or a stacked film thereof. A thickness of the first insulating layer 300 may be in a range from 30 nanometers to 200 nanometers.

In the embodiments, the gate electrode layer 400 may be a metal layer of metal such as Mo, Ti, W, or a stacked layer thereof. A thickness of the gate electrode layer 400 is in a range from 0.1 micron to 1 micron.

In the embodiments, the second insulating layer 500 may be a stacked layer of SiOx and SiNx.

In the embodiments, the source and drain electrode layer 600 may be a metal layer of metal such as Mo, Ti, W, Al, Cu, or a stacked layer thereof.

In the embodiments, the gate electrode layer 400 may be annularly arranged on a side of the first insulating layer 300 away from the active layer 200. Specifically, the gate electrode layer 400 may be arranged against a side wall of a portion of the first insulating layer 300 surrounding the stacked structure of the first doped portion 211, the channel layer 220 and the second active layer 230. The annular gate electrode layer 400 surrounds the stacked structure constituted by the first doped portion 211, the channel layer 220 and the second active layer 230.

In the embodiments, an orthographic projection of the channel layer 220 on the gate electrode layer 400 at least partially overlaps with the gate electrode layer 400, so that the gate electrode layer 400 can at least partially face the channel layer 220, thereby exerting a control effect and realizing a switching control function of the thin film transistor. The annular gate electrode layer 400 has a stronger ability to control the channel layer 220 and may further reduce the leakage current of the vertical thin film transistor.

In the embodiments, the second insulating layer 500 covers surfaces of the first insulating layer 300 and the gate electrode layer 400, and a surface of the second insulating layer 500 away from the insulating substrate 100 is flat, so that the source and drain electrode layer 600 may be arranged relatively stably on the surface of the second insulating layer 500.

In the embodiments, the source and drain electrode layer 600 may include a source electrode 610 and a drain electrode 620. The first insulating layer 300 and the second insulating layer 500 are provided therein with a first via hole 101 corresponding to the source electrode 610 and a second via hole 102 corresponding to the drain electrode 620. The first via hole 101 and the second via hole 102 extend along a stacking direction of the first insulating layer 300 and the second insulating layer 500. An orthographic projection of the first via hole 101 on the insulating substrate 100 is located within an orthographic projection of the second active layer 230 on the insulating substrate 100, and an orthographic projection of the second via hole 102 on the insulating substrate 100 is located in the orthographic projection of the second doped portion 212 on the insulating substrate 100. The source electrode 610 is connected to the second active layer 230 through the first via hole 101, and the drain electrode 620 is connected to the second doped portion 212 through the second via hole 102.

In the embodiments, by providing the first via hole 101 and the second via hole 102 in both the first insulating layer 300 and the second insulating layer 500 corresponding to the second active layer 230 and the second doped portion 212, respectively, and arranging the source and drain electrode layer 600 to be connected to the second active layer 230 and the second doped portion 212 through the first via hole 101 and the second via hole 102, respectively, it is possible to make the migration path of the carriers of the thin film transistor need to pass through the first doped portion 211, thereby extending the length of the "channel region", reducing the leakage current while maintaining a relatively high mobility. Moreover, the connection structure between the source and drain electrode layer 600 and the active layer 200 in the present application is simple, which is easy to be manufactured, thereby reducing the manufacturing cost.

Referring to FIGS. 1 and 3, for the thin film transistor in the present application, the gate electrode layer 400 may include a first gate electrode portion 410 and a second gate electrode portion 420 that are integrally connected. The first gate electrode portion 410 is disposed above the insulating substrate 100, and the second gate electrode portion 420 is disposed above and insulated from the second doped portion 212.

In the embodiments, the first gate electrode portion 410 and the second gate electrode portion 420 are integrally manufactured. However, due to the stacking height of the second doped portion 212, the gate electrode portion above the doped portion 212 protrudes from a gate electrode portion at another position. That is, the first gate electrode portion 410 and the second gate electrode portion 420 are formed. It will be understood that, due to the "raising" effect of the second doped portion 212, a distance between the insulating substrate 100 and a surface of the second gate electrode portion 420 away from the insulating substrate 100 is greater than a distance between the insulating substrate 100 and a surface of the first gate electrode portion 410 away from the insulating substrate 100.

In the embodiments, an orthographic projection of the channel layer 220 on the first gate electrode portion 410 is located in the first gate electrode portion 410, and an orthographic projection of the channel layer 220 on the second gate electrode portion 420 at least partially overlaps with the second gate electrode portion 420.

It will be understood that, referring to FIG. 1, in the case where the thickness of the second doped portion 212 is the same as the thickness of the first doped portion 211, due to the "raising" effect of the second doped portion 212, a "facing" area between the second gate electrode portion 420 and the channel layer 220 is reduced, which results in the orthographic projection of the channel layer 220 on the second gate electrode portion 420 partially overlapping with the second gate electrode portion 420. Referring to FIG. 3, in the case where the thickness of the second doped portion 212 is smaller than the thickness of the first doped portion 211, the second gate electrode portion 420 has a smaller "raising" effect, the "facing" area between the second gate electrode portion 420 and the channel layer 220 may be increased accordingly, and even the channel layer 220 may completely face the second gate electrode portion 420. That is, the orthographic projection of the channel layer 220 on the second gate electrode portion 420 completely overlaps with the second gate electrode portion 420.

In the embodiments, since the first gate electrode portion 410 is not "raised" by the second doped portion 212, the first gate electrode portion 410 may completely face the channel layer 220, thereby having a good control on the channel layer 220.

Figure 6:
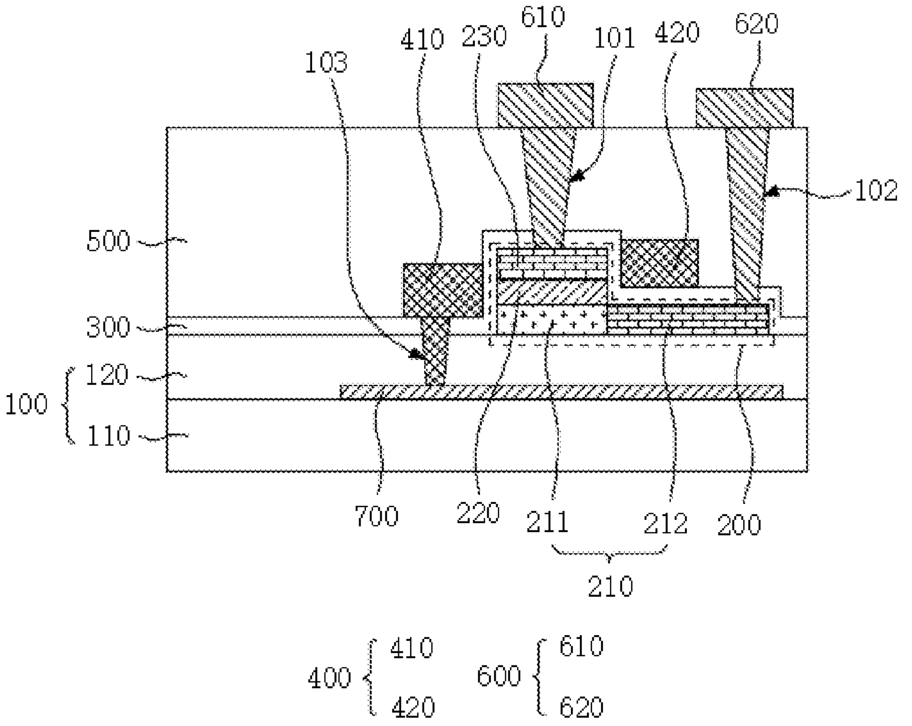
FIG. 6 is a structural diagram of a thin film transistor with a fifth stacked structure in the present application.
Figure 7:
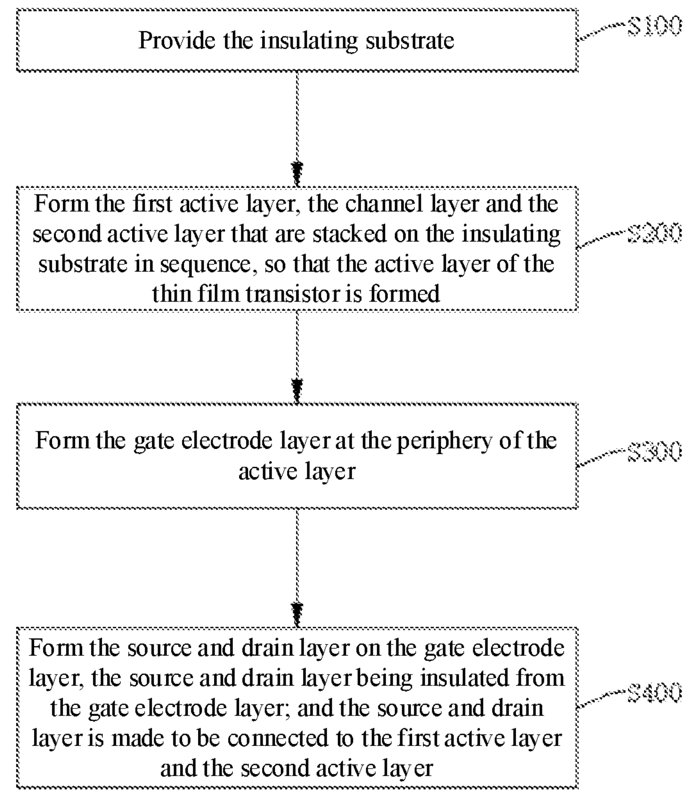
FIG. 7 is a flow chart of a manufacturing method of a thin film transistor in the present application.

Referring to FIG. 6, in the embodiments, the light-shielding layer 700 may be disposed between the base substrate 110 and the buffer layer 120. The buffer layer 120 is provided therein with a third via hole 103 corresponding to the first gate electrode portion 410. The first gate electrode portion 410 may be connected to the light-shielding layer 700 through the third via hole 103, so that charges accumulated in the gate electrode layer 400 may be introduced into the light-shielding layer 700. As a result, the charges accumulated in the gate electrode layer 400 is reduced and the device stability of the thin film transistor is improved.

Referring to FIG. 3, in the embodiments, the light-shielding layer 700 may be disposed between the base substrate 110 and the buffer layer 120. The buffer layer 120 is provided therein with a third via hole 103 corresponding to the first gate electrode portion 410. The first gate electrode portion 410 may be connected to the light-shielding layer 700 through the third via hole 103, so that charges accumulated in the gate electrode layer 400 may be introduced into the light-shielding layer 700. As a result, the charges accumulated in the gate electrode layer 400 is reduced and the device stability of the thin film transistor is improved.

In the embodiments of the present application, the first active layer 210 is arranged to include the first doped portion 211 and the second doped portion 212 with different dopant ion concentrations, so that the second doped portion 212 and the second active layer 230 serve as two "doped regions" of the thin film transistor, respectively, and the channel layer 220 and the first doped portion 211 constitute a "channel region" of the thin film transistor, which equivalently increases the channel length. In addition, an annular gate electrode layer 400 is arranged to surround the channel layer 220, which enhances the capability of control on the channel layer 220, thereby reducing the leakage current. Moreover, since the first doped portion 211 is doped with ions, the mobility there is higher than the channel layer 220, which equivalently improves the mobility in the "channel region" of the thin film transistor. Therefore, the thin film transistor provided in the present application may better solve the problems of excessive leakage current and low mobility.

Referring to FIGS. 7 to 13, embodiments of the present application also provide a manufacturing method of a thin film transistor, and the method is used to manufacture the thin film transistor described in the embodiments above.

In the embodiments, the manufacturing method of the thin film transistor may include following steps.

Figure 8:
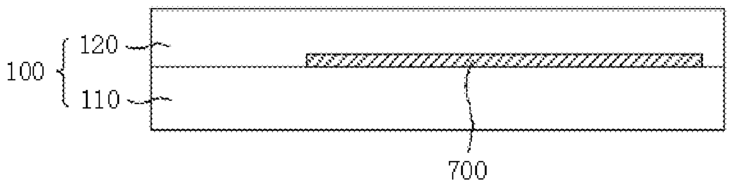
FIGS. 8 to 13 are schematic diagrams of a process of a manufacturing method of a thin film transistor described in the present application.

In S100, the insulating substrate 100 is provided, as shown in FIG. 8.

Figure 9:
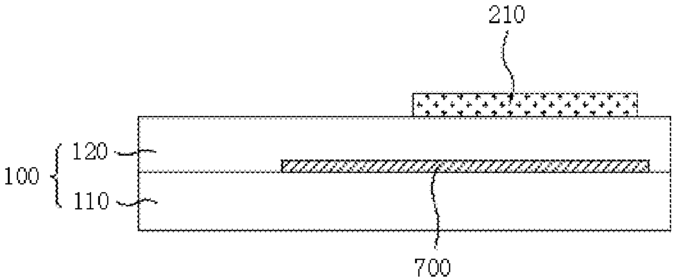
Figure 10:
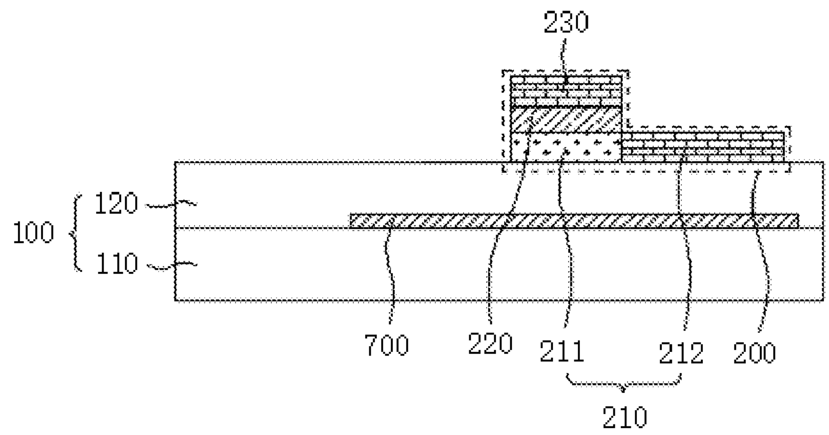

In S200, the first active layer 210, the channel layer 220 and the second active layer 230 that are stacked are sequentially formed on the insulating substrate 100, so that the active layer 200 of the thin film transistor is formed, as shown in FIGS. 9 and 10.

Figure 11:
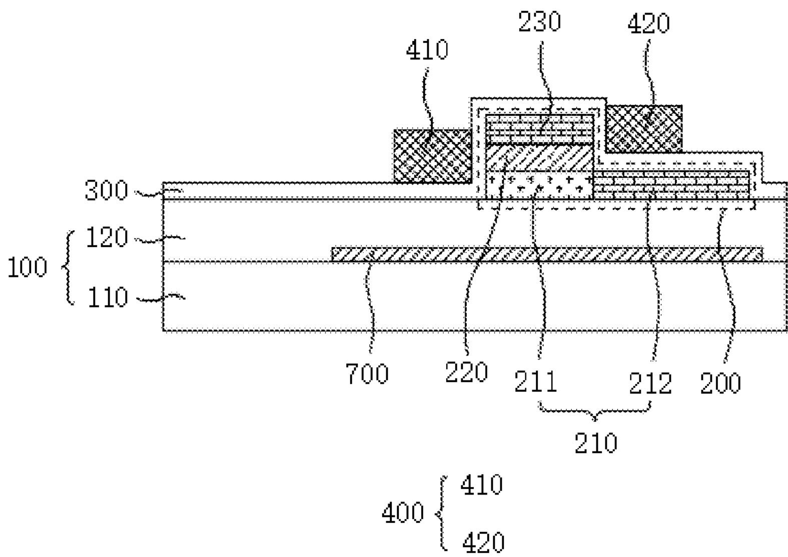

In S300, the gate electrode layer 400 is formed at the periphery of the active layer 200, as shown in FIG. 11.

Figure 12:
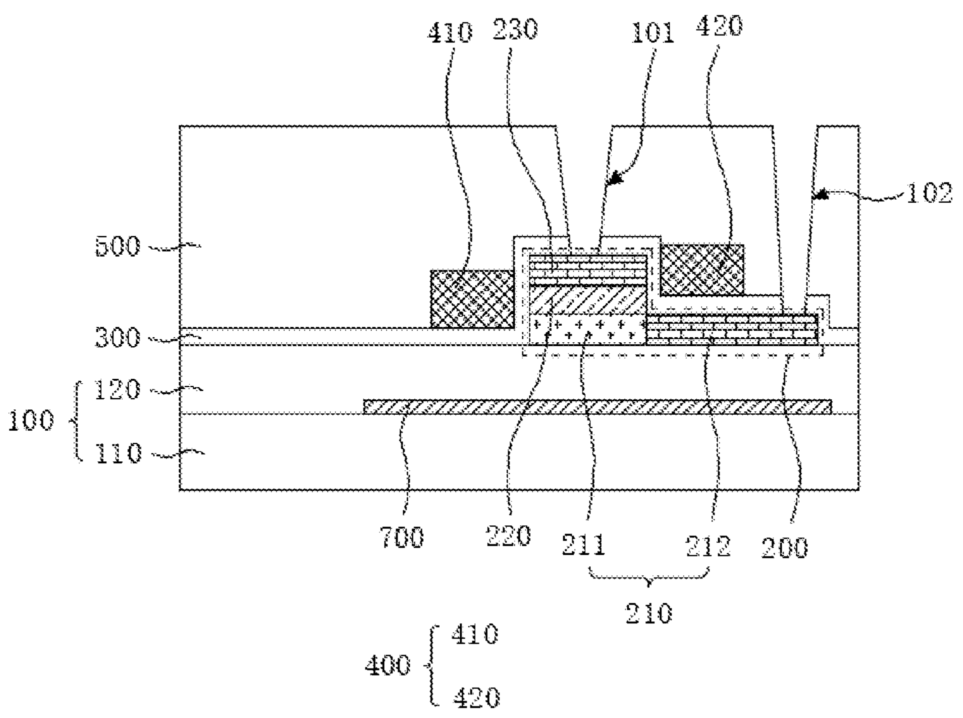
Figure 13:
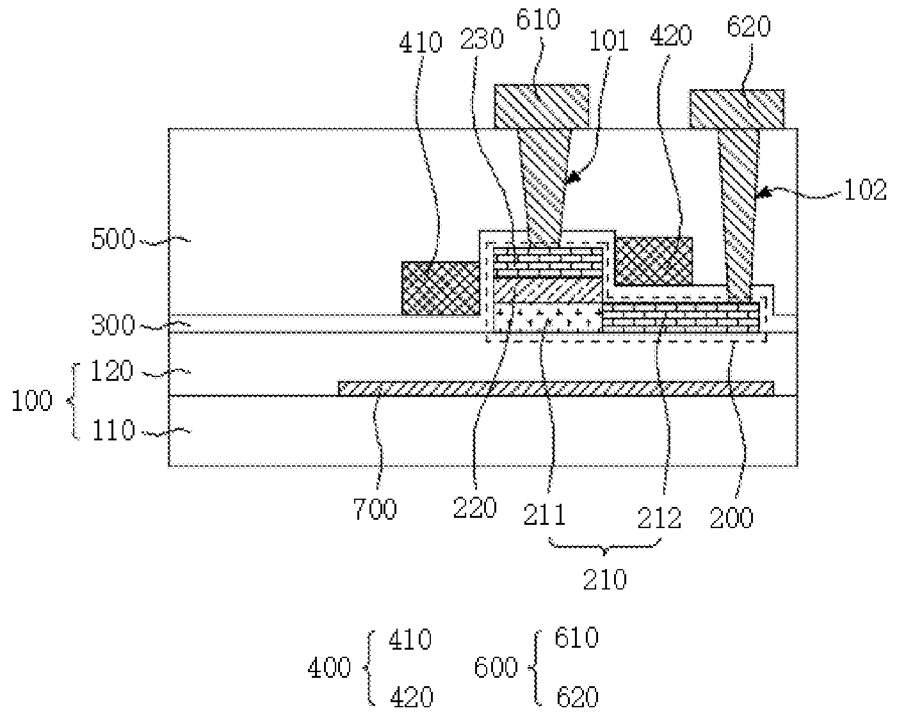

In S400, the source and drain electrode layer 600 is formed on and insulated from the gate electrode layer 400; and the source and drain electrode layer 600 is made to be connected to the first active layer 210 and the second active layer 230, as shown in FIGS. 12 and 13.

In the embodiments, the thin film transistor is manufactured through the above steps. As a result, for the thin film transistor, a vertical structure may be used to reduce the occupied area and size; in addition, the length of the "channel region" can be extended through the first doped portion 21, and thus the mobility is improved and a lower leakage current is achieved. Moreover, the annular gate electrode layer 400 arranged at the periphery of the active layer 200 is used to enhanced the control on the channel layer 220, which further reduces the leakage current of the vertical thin film transistor, thereby improving the device performance and stability of the thin film transistor.

In the embodiments, the step S200 may include following steps.

In S210, a first polysilicon material layer is formed on the insulating substrate 100, as shown in FIG. 8.

In the embodiments, the thickness of the first polysilicon material layer may be in a range of 10 nanometers to 100 nanometers, and the first polysilicon material layer may be formed of an a-Si material layer through processes such as laser annealing.

In S220, the first polysilicon material layer is lightly doped to form a lightly doped material layer, as shown in FIG. 9.

In the embodiments, ions with which the first polysilicon material layer is lightly doped may be phosphorus ions.

In S230, a channel layer 220 is formed on a portion of the lightly doped material layer, as shown in FIG. 10.

In the embodiments, the channel layer 220 may be formed by converting an a-Si material layer with a thickness of 10 nanometers to 200 nanometers into a polysilicon material through processes such as laser annealing.

In S240, a second polysilicon material layer is formed on the channel layer 220, as shown in FIG. 10.

In the embodiments, the second polysilicon material layer may be formed by converting an a-Si material layer with a thickness of 50 nanometers to 300 nanometers into a polysilicon material through processes such as laser annealing.

In S250, a secondary doping process is performed on the second polysilicon material layer and on the lightly doped material layer except the portion corresponding to the channel layer 220, and thus the second active layer 230 located on a side of the channel layer 220 away from the insulating substrate 100 and the second doped portion 212 located below a side of the channel layer 220 are simultaneously formed, the portion of the lightly doped material layer that has not been processed by the secondary doping is the first doped portion 211, as shown in FIG. 10.

In the embodiments, the first doped portion 211, the second doped portion 212 and the second active layer 230 of the first active layer 210 are formed through the above steps, so that the second active layer 230, the first doped portion 211 and the second doped portion 212 may be formed together, which can effectively improve the production efficiency of the active layer 200 and save mask costs.

Embodiments of the present application also provides an electronic device, the electronic device may include the thin film transistor described in the embodiments above.

The thin film transistor and the electronic device thereof provided in the embodiments of the present application have been described in detail. Specific examples are used herein to illustrate the principles and implementation methods of the present application. The description of the embodiments above is intended only to help understand the method and core idea of the present application. In addition, for those skilled in the art, there will be changes in the specific implementation and application scope based on the ideas of the present application. In summary, the contents of this specification should not be understood as limitations on the present application.

What is claimed is:

1. A thin film transistor, comprising:

an insulating substrate;

an active layer disposed on the insulating substrate, the active layer comprising: a first active layer, a channel layer, and a second active layer that are stacked; and a gate electrode layer, the gate electrode layer being insulated from and annularly arranged at a periphery of the channel layer;

wherein the first active layer comprises a first doped portion and a second doped portion, the first doped portion is connected to the channel layer and the second doped portion, a concentration of dopant ions in the first doped portion is less than a concentration of dopant ions in the second doped portion, and wherein in a thickness direction of the insulating substrate, a thickness of the second doped portion is less than or equal to a thickness of the first doped portion.

2. The thin film transistor according to claim 1, wherein a ratio of the concentration of the dopant ions in the first doped portion to the concentration of the dopant ions in the second doped portion is in a range of 1/10 to 1/5.

3. The thin film transistor according to claim 1, wherein the first doped portion and the second doped portion are disposed on the insulating substrate in a same layer.

4. The thin film transistor of claim 3, wherein in the thickness direction of the insulating substrate, a ratio of the thickness of the second doped portion to the thickness of the first doped portion is in a range of 1/4 to 1.

5. The thin film transistor according to claim 3, wherein the channel layer corresponds to the first doped portion in the thickness direction of the insulating substrate; and wherein an orthographic projection of the channel layer on the first active layer partially overlaps with each of the first doped portion and the second doped portion.

6. The thin film transistor according to claim 3, wherein the channel layer corresponds to the first doped portion in the thickness direction of the insulating substrate; and wherein an orthographic projection of the channel layer on the first active layer is located in the first doped portion, and the orthographic projection of the channel layer on the first active layer does not overlap with the second doped portion.

7. The thin film transistor according to claim 6, wherein an orthographic projection of the channel layer on the gate electrode layer at least partially overlaps with the gate electrode layer.

8. The thin film transistor according to claim 7, wherein the gate electrode layer comprises a first gate electrode portion and a second gate electrode portion that are integrally connected, the first gate electrode portion is disposed above the insulating substrate, and the second gate electrode portion is insulated from and disposed above the second doped portion; and wherein an orthographic projection of the channel layer on the first gate electrode portion is located in the first gate electrode portion, and an orthographic projection of the channel layer on the second gate electrode portion at least partially overlaps with the second gate electrode portion.

9. The thin film transistor according to claim 8, wherein an orthographic projection of the second gate electrode portion on the insulating substrate partially overlaps with an orthographic projection of the channel layer on the insulating substrate.

10. The thin film transistor according to claim 1, wherein the channel layer comprises dopant ions, and a concentration of dopant ions at a side of the channel layer away from the insulating substrate is greater than a concentration of dopant ions at a side of the channel layer proximate to the insulating substrate.

11. The thin film transistor according to claim 7, wherein the thin film transistor further comprises a first insulating layer disposed between the active layer and the gate electrode layer; and wherein the first insulating layer covers a surface of the active layer and a surface of a region of the insulating substrate where the active layer is not located.

12. The thin film transistor according to claim 11, wherein the thin film transistor further comprises a second insulating layer and a source and drain electrode layer, the second insulating layer covers the first insulating layer and the gate electrode layer, and the source and drain electrode layer is disposed on the second insulating layer; and wherein a first via hole and a second via hole are provided in the first insulating layer and the second insulating layer, and the source and drain electrode layer is connected to the second doped portion through the first via hole, and the source and drain electrode layer is connected to the second doped portion through the second via hole.

13. The thin film transistor according to claim 7, wherein the thin film transistor further comprises a light-shielding layer disposed in the insulating substrate, and an orthographic projection of the active layer on the light-shielding layer is located in the light-shielding layer; and wherein the gate electrode layer and the light-shielding layer are connected through a third via hole.

14. An electronic device, comprising a thin film transistor, the thin film transistor comprising:

an insulating substrate;

an active layer disposed on the insulating substrate, the active layer comprising: a first active layer, a channel layer, and a second active layer that are stacked; and a gate electrode layer, the gate electrode layer being insulated from and annularly arranged at a periphery of the channel layer;

wherein the first active layer comprises a first doped portion and a second doped portion, the first doped portion is connected to the channel layer and the second doped portion, a concentration of dopant ions in the first doped portion is less than a concentration of dopant ions in the second doped portion, and wherein in a thickness direction of the insulating substrate, a thickness of the second doped portion is less than or equal to a thickness of the first doped portion.

15. The electronic device of claim 14, wherein a ratio of the concentration of the dopant ions in the first doped portion to the concentration of the dopant ions in the second doped portion is in a range of 1/10 to 1/5.

16. The electronic device of claim 14, wherein the first doped portion and the second doped portion are disposed on the insulating substrate in a same layer.

17. The electronic device of claim 16, wherein in the thickness direction of the insulating substrate, a ratio of the thickness of the second doped portion to the thickness of the first doped portion is in a range of 1/4 to 1.

18. The electronic device of claim 16, wherein the channel layer corresponds to the first doped portion in the thickness direction of the insulating substrate; and wherein an orthographic projection of the channel layer on the first active layer partially overlaps with each of the first doped portion and the second doped portion.

19. The electronic device of claim 16, wherein the channel layer corresponds to the first doped portion in the thickness direction of the insulating substrate; and wherein an orthographic projection of the channel layer on the first active layer is located in the first doped portion, and the orthographic projection of the channel layer on the first active layer does not overlap with the second doped portion.

20. The electronic device of claim 19, wherein an orthographic projection of the channel layer on the gate electrode layer at least partially overlaps with the gate electrode layer.

* * * * *